(12) United States Patent
Nagashima et al.

(10) Patent No.: US 10,121,724 B2
(45) Date of Patent: Nov. 6, 2018

(54) HEAT DIFFUSION SHEET

(71) Applicant: DEXERIALS CORPORATION, Tokyo (JP)

(72) Inventors: Minoru Nagashima, Utsunomiya (JP); Teruo Hiyama, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/300,400

(22) PCT Filed: Feb. 17, 2015

(86) PCT No.: PCT/JP2015/054263
§ 371 (c)(1),
(2) Date: Sep. 29, 2016

(87) PCT Pub. No.: WO2015/151613
PCT Pub. Date: Oct. 8, 2015

(65) Prior Publication Data
US 2017/0141009 A1 May 18, 2017

(30) Foreign Application Priority Data
Mar. 31, 2014 (JP) .................................. 2014-074865

(51) Int. Cl.
*H01L 23/373* (2006.01)
*B32B 7/00* (2006.01)
(Continued)

(52) U.S. Cl.
CPC ............ *H01L 23/3735* (2013.01); *B32B 7/12* (2013.01); *B32B 9/007* (2013.01); *B32B 9/045* (2013.01);
(Continued)

(58) Field of Classification Search
None
See application file for complete search history.

(56) References Cited

U.S. PATENT DOCUMENTS

| | | | | |
|---|---|---|---|---|
| 4,237,088 A | * | 12/1980 | Yoshimura | .............. B29C 55/04 264/235.8 |
| 2005/0142370 A1 | * | 6/2005 | Mussig | ....................... C08J 7/04 428/516 |
| 2010/0009174 A1 | * | 1/2010 | Reis | .......................... B32B 3/26 428/332 |

FOREIGN PATENT DOCUMENTS

| | | |
|---|---|---|
| CN | 202135433 U | 2/2012 |
| JP | 2007-012913 A | 1/2007 |

(Continued)

OTHER PUBLICATIONS

Apr. 7, 2015 International Search Report issued in Patent Application No. PCT/JP2015/054263.

(Continued)

*Primary Examiner* — David Sample
*Assistant Examiner* — Nicole T Gugliotta
(74) *Attorney, Agent, or Firm* — Oliff PLC

(57) ABSTRACT

A heat diffusion sheet 2 has a configuration in which a composite adhesive film is formed on a surface of a graphite sheet 10 having a thickness of 300 μm or more and 2,000 μm or less. This composite adhesive film has a configuration in which (A) an acrylic adhesive layer that has a thickness of 5 μm or more and 15 μm or less and does not contain a thermally conductive material, (B) a polyester film having a thickness of 20 μm or more and 60 μm or less, and (C) a silicone adhesive layer that has a thickness of 2 μm or more and 25 μm or less, does not contain a thermally conductive material, and has a peel strength of 0.005 N/cm or more and 1.0 N/cm or less are sequentially layered on the graphite sheet 10.

1 Claim, 1 Drawing Sheet

(51) Int. Cl.
  *B32B 9/00* (2006.01)
  *B32B 27/36* (2006.01)
  *B32B 7/12* (2006.01)
  *B32B 9/04* (2006.01)
  *F28F 21/02* (2006.01)

(52) U.S. Cl.
  CPC .............. *B32B 27/36* (2013.01); *F28F 21/02* (2013.01); *H01L 23/373* (2013.01); *H01L 23/3737* (2013.01); *B32B 2250/02* (2013.01); *B32B 2255/10* (2013.01); *B32B 2255/26* (2013.01); *B32B 2307/302* (2013.01); *B32B 2307/50* (2013.01); *B32B 2307/732* (2013.01); *B32B 2307/748* (2013.01); *B32B 2313/04* (2013.01); *B32B 2367/00* (2013.01); *B32B 2405/00* (2013.01); *B32B 2457/14* (2013.01); *B32B 2457/206* (2013.01); *H01L 2924/0002* (2013.01)

(56) References Cited

FOREIGN PATENT DOCUMENTS

| | | | |
|---|---|---|---|
| JP | 2007-180281 A | 7/2007 | |
| JP | 2007-261087 A | 10/2007 | |
| JP | 2008-060527 A | 3/2008 | |
| JP | 2010-001191 | * 1/2010 | ............. C01B 31/04 |
| JP | 2010-001191 A | 1/2010 | |
| JP | 2010-219290 A | 9/2010 | |
| JP | 2010-254979 A | 11/2010 | |
| WO | 2008/149920 A1 | 12/2008 | |

OTHER PUBLICATIONS

Jun. 29, 2018 Office Action issued in Chinese Patent Application No. 201580018049.2.

\* cited by examiner

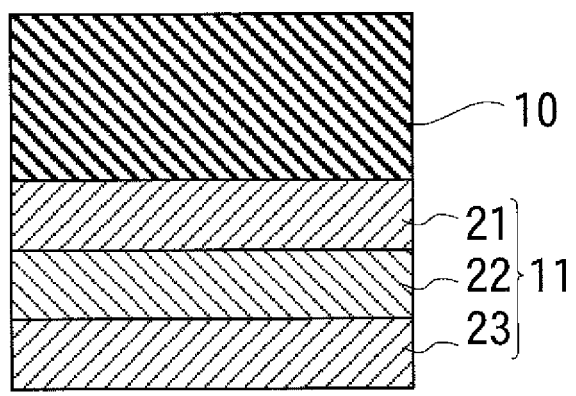

HEAT DIFFUSION SHEET

TECHNICAL FIELD

The present invention relates to a heat diffusion sheet used in heat radiation, and in particular, a heat diffusion sheet of diffusing heat in a spreading direction of the heat diffusion sheet.

BACKGROUND ART

In recent years, the performance of an electronic appliance such as a personal computer, a mobile phone, and PDA has been remarkably improved, and this improvement depends on remarkably improved performance of a CPU. With such improved performance of the CPU, the amount of heat generated by the CPU has also been remarkably increased. Therefore, an important problem is how to dissipate heat in the electronic appliance.

As countermeasures of heat, there are methods such as air cooling by a fan, a heat pipe, and water cooling using water. However, the methods all require a new device for heat dissipation, and as a result, have defects in which the weight of the appliance may be increased and additionally, noise, the quantity of used electricity, and the like may be increased.

On the other hand, a method for diffusing heat generated by the CPU into a wide surface as rapidly as possible is to increase the cooling efficiency, and is the most realistic method as a cooling method in the electronic appliance such as a mobile phone and a personal computer.

In recent years, in a display device typified by an organic EL element, the size has been increased, and the precision of the device, especially uniformity, has been considered important. In particular, in the organic EL element, since the element itself is constituted by an organic substance, degradation due to heat has been known to affect the life of the element, and especially light-emitting properties and a change of chromaticity. Heat generated by a drive circuit constituting the device, or the like, is accompanied by a temporal change.

As a thermal conduction sheet used for such heat dissipation, much attention has been recently directed to sheet-shaped graphite.

This is because a good-quality graphite sheet has a very high thermal conductivity of 100 to 1,000 W/(m·K) and remarkably high performance as compared with properties of thermal conductivity of gelled heat dissipation material and sheet-shaped heat dissipation material other than the graphite sheet, and is the most suitable to diffuse heat.

Patent Literature 1 describes a thermal conduction sheet for directly transmitting heat from a heating element to a heat dissipation member. Patent Literatures 2 and 3 describe a thermal conduction sheet having heat diffusion properties of diffusing heat from a heating element in a plane direction.

As a thermal conduction sheet, attention has been paid to the thermal conduction sheets described in Patent Literatures 2 and 3, not in Patent Literature 1, and in particular, a so-called graphite sheet in which graphite is produced into a sheet.

Specifically, the graphite sheet has a high thermal conductivity of 100 to 1,000 W/(m·K) in a plane direction and allows heat from the heating element to be diffused to make the temperature within the electronic appliance uniform. Thus, the graphite sheet prevents a decrease in function of a component disposed in the appliance.

A third embodiment of Patent Literature 2 (paragraph 0048) discloses a technique in which a double-sided tape in which an adhesive layer is formed on both faces of a base material such as a PET film is bonded to a surface of the graphite sheet in advance and the graphite sheet is bonded to a target surface and part (hereinafter referred to as surface to be covered) of the electronic appliance through the adhesive layer. However, the adhesive layer is not usually thermal conductive, and tends to reduce a heat diffusion effect of the whole sheet. An acrylic adhesive layer usually used as the adhesive layer is difficult to be reworked (to be peeled once for re-adhering).

In Patent Literature 3, a graphite sheet having an elastic layer, such as silicone rubber (corresponding to the adhesive layer), containing a thermally conductive material is provided on a surface (claim 1) to try to prevent a decrease in thermal conductivity and solve reworking problem.

In an image panel, and in particular, an image display panel such as an OLED panel (organic EL panel), a surface constituting the panel is made of glass and is very smooth. However, when the adhesive layer contains the thermally conductive material, the surface of the adhesive layer is rough. Therefore, the initial adhesion may be reduced. Although this reduced initial adhesion contributes to reworking, the ratio of a resin component constituting the adhesive layer is relatively decreased. Therefore, a reduction in adhesion reliability is not avoided (problem 1).

When the graphite sheet has a thickness of 300 μm or less, this is not a serious problem. However, when the thickness of the graphite sheet is larger than that, the rigidity of the whole sheet increases, and as a result, it is difficult for the sheet to be bent during reworking.

Therefore, the graphite sheet is reworked (pulled upward) so that an angle from the target surface is not formed. However, in this case, a silicone adhesive layer tends to result in a cohesive failure, and as a result, tends to remain on the surface to be covered (problem 2).

CITATION LIST

Patent Literature

Patent Literature 1: Japanese Patent Application Laid-Open No. 2007-180281
Patent Literature 2: Japanese Patent Application Laid-Open No. 2008-060527
Patent Literature 3: Japanese Patent Application Laid-Open No. 2007-012913

SUMMARY OF INVENTION

Technical Problem

In order to solve the problems, an object of the present invention is to provide a repeelable heat diffusion sheet that can efficiently transmit heat generated by an element and a device while excellent thermal conductivity is sufficiently secured.

Another object of the present invention is to provide a heat diffusion sheet having high adhesion reliability.

Even another object of the present invention is to provide a heat diffusion sheet in which a silicone adhesive layer can be peeled without cohesive failure.

Solution to Problem

An embodiment according to the present invention to achieve the objects of the present invention is a heat diffusion sheet comprising a graphite sheet and a composite adhesive film formed on a surface of the graphite sheet, wherein the graphite sheet has a thickness of 300 m or more and 2,000 μm or less, and the composite adhesive film is configured such that
(A) an acrylic adhesive layer that has a thickness of 5 μm or more and 15 μm or less and does not contain a thermally conductive material,
(B) a polyester film having a thickness of 20 μm or more and 60 μm or less, and
(C) a silicone adhesive layer that has a thickness of 2 μm or more and 25 μm or less, does not contain a thermally conductive material, and has a peel strength of 0.005 N/cm or more and 1.0 N/cm or less are sequentially layered from the graphite sheet.

Advantageous Effects of Invention

As described above, the present invention is the heat diffusion sheet using the composite adhesive film having combined adhesive layer with the graphite sheet. Such a heat diffusion sheet has excellent thermal conductivity in a spreading direction due to use of the graphite sheet. Heat generated from a heater element is transmitted in the spreading direction, and the temperature of the heat diffusion sheet is made uniform. Even when heat is partially generated by an adherend to which the heat diffusion sheet is bonded, an effect of uniformly increasing the temperature is exerted.

The silicone adhesive layer has a surface that is strongly bonded to the polyester film and another surface that has an adhesion force capable of being peeled from an adherend such as a glass plate. Therefore, after the silicone adhesive layer is peeled from the adherend, the silicone adhesive layer can be reused.

The composite adhesive film has a low thermal conductivity, but the thickness thereof is low, and the thermal resistance thereof in a film thickness direction is low. Therefore, heat generated from the adherend is easy to be transmitted to the graphite sheet.

BRIEF DESCRIPTION OF DRAWINGS

FIG. 1 is a view illustrating a heat diffusion sheet of the present invention.

DESCRIPTION OF EMBODIMENTS

Embodiments of the present invention will be described in accordance with the following items.
1. Heat diffusion sheet of the present invention (graphite sheet with adhesive)
2. Graphite sheet
3. Composite adhesive film
4. Acrylic adhesive layer
5. Polyester film
6. Silicone adhesive layer
7. Relationship between polyester film and silicone adhesive layer
8. Production method of graphite sheet with adhesive
<1. Graphite Sheet with Adhesive of the Present Invention>

In FIG. 1, a numeral 2 represents a heat diffusion sheet of the present invention that has a graphite sheet 10 and a composite adhesive film 11.

This heat diffusion sheet 2 is bonded to an inside and a site of an appliance such as a display device typified by an organic EL element, and has a function of diffusing heat from a heat source thereof.

<2. Graphite Sheet>

The graphite sheet 10 used in the present invention is mainly produced from natural graphite, has a high thermal conductivity, and has properties in which the thickness can be adjusted to any thickness from several tens microns to several thousands microns.

In the graphite sheet 10 used in the present invention, the thermal conduction is anisotropic due to crystallinity thereof. The thermal conductivity in a thickness direction is low, and heat is unlikely to be transmitted in this direction. The thermal conductivity in a spreading direction (a direction parallel to a surface of the sheet) is high, and heat is likely to be transmitted in this direction. The thermal conductivity in the spreading direction is several times the thermal conductivity of copper or aluminum. The graphite sheet 10 is lighter than a metal sheet.

The graphite sheet generally has a thickness falling within a range of 50 μm to 2,000 μm. In order to use the heat diffusion sheet in an appliance requiring a decrease in thickness, such as an image panel of OLED, and cope with problems in which the flexibility of the whole sheet is impaired and wrinkling is likely to occur, it is preferable that the graphite sheet 10 used in the heat diffusion sheet 2 of the present invention have a thickness of 600 μm or less.

When the thickness of the graphite sheet 10 is larger than 300 μm, and particularly larger than 400 μm, as described below, an effect thereof is remarkable in the composite adhesive film 11 of the present invention.

The graphite sheet 10 has a thermal conductivity of 200 to 600 W/(m·K). The thermal conductivity is affected by the orientation, molecular weight, rolling density, and the like of graphite.

<3. Composite Adhesive Film>

The composite adhesive film 11 of the present invention is formed on a surface of the graphite sheet 10, and has a role of bonding the graphite sheet 10 to a surface of a subject to be bonded.

The composite adhesive film 11 does not contain a thermally conductive material, as described below. For this reason, the thermal conductivity of the whole composite adhesive film 11 falls within a range of 0.05 to 0.5 W/(m·K).

In order not to impair the thermal conductivity of the graphite sheet 10 and not to affect another effect of the present invention, it is preferable that the total thickness of the composite adhesive film 11 fall within a range of 27 μm to 100 μm.

Specifically, the composite adhesive film 11 has a configuration in which an acrylic adhesive layer 21 is provided on a surface of a polyester film 22, a silicone adhesive layer 23 is provided on an opposite surface thereof, and a surface of the acrylic adhesive layer 21 is disposed in contact with a surface of the graphite sheet 10.

<4. Acrylic Adhesive Layer>

A material constituting the acrylic adhesive layer 21 contains (a) an acrylic copolymer as a base polymer, (b) a tackifier that is compatible with the base polymer and expresses adhesion, and (c) a curing agent for adjusting the cohesive force of the acrylic copolymer (a). A reaction of the acrylic copolymer (a) with the curing agent (c) is terminated, but not completed, before the acrylic adhesive layer 21 comes into contact with the graphite sheet 10.

As the acrylic copolymer (a), an acrylic copolymer using, as a monomer having a functional group such as a methacryloyl group, a hydroxyl group, a carboxyl group, a methylol group, or an amido group, one selected from monomers including acrylic acid, methacrylic acid, 2-hydroxy ethyl or propyl acrylate, 2-hydroxypropyl methacrylate, N-methylolacrylamide, N-methylolmethyacrylamide, acrylamide, and methacrylamide in addition to 2-hydroxyethyl methacrylate can be used. As the tackifier (b), a low-molecular polymer including a phenolic resin, a terpene-based resin, a rosin-based resin, a hydrogenated rosin-based resin, a xylene resin, or an acrylic resin can be used.

When a monomer having a hydroxyl group, or the like, is contained as a component of the acrylic copolymer (a), an isocyanate-type curing agent, or the like, can be used as the curing agent (c). On the other hand, when a monomer having a functional group such as an epoxy group, or the like, is contained, an ethyleneimine-type curing agent, or the like, can be used.

The thickness of the acrylic adhesive layer 21 is 5 μm to 15 μm. When the thickness is smaller than 5 μm, the adhesion force to the adherend is insufficient. In contrast, when the thickness is larger than 15 μm, the thermal resistance increases depending on the thickness of the polyester film 22, and favorable thermal conduction is not achieved. Regarding the thermally conductive material not contained, the acrylic adhesive layer is the same as the silicone adhesive layer 23 described below.

<5. Polyester Film>

The polyester film 22 can produce the strength of the composite adhesive film 11 as a whole, and has a role of facilitating reworking due to the relationship in the thickness between the polyester film and the silicone adhesive layer 23 described below.

Further, the polyester film 22 has also a role of preventing mixing the acrylic adhesive layer 21 with the silicone adhesive layer 23 during direct layering of the acrylic adhesive layer 21 and the silicone adhesive layer 23.

For the polyester film 22, polyethylene terephthalate (PET) can be preferably used. The thickness thereof falls within a range of 20 μm or more and 60 μm or less. When a biaxially stretched PET film is used, the tensile strength in an MD direction may preferably fall within a range of 100 MPa or more and 300 MPa or less, and the tensile strength in a TD direction may preferably fall within a range of 10 MPa or more and 50 MPa or less.

The storage elastic modulus may preferably fall within a range of 1,000 Pa or more and 10,000 MPa or less.

<6. Silicone Adhesive Layer>

The silicone adhesive layer 23 is formed of an addition reaction-type silicone resin, and is selected so that the adhesive force (peel strength) to an image panel (glass) such as OLED is 0.005 to 1.0 N/cm. Specifically, organosiloxane such as dimethylsiloxane can be used.

As described above, the strength of the composite adhesive film 11 is enhanced by the polyester film 22. Therefore, the silicone adhesive layer 23 may not be formed so as to be thick in the present invention. Specifically, the thickness, of the silicone adhesive layer 23 falls within a range of 5 μm to 25 μm.

The silicone adhesive layer 23 is the same as the acrylic adhesive layer 21 in that the thermally conductive material is not contained.

<7. Relationship Between Polyester Film and Silicone Adhesive Layer>

The polyester film 22 and the silicone adhesive layer 23 affect reworking properties, unlike the acrylic adhesive layer 21. However, it is preferable that the relationship in thickness be varied according to the thickness or a desired area of the graphite sheet 10.

For example, when the thickness of the graphite sheet 10 is 300 μm to 600 μm and the area thereof is as relatively small as 25 to 300 cm$^2$ (for example, 12 cm×6.7 cm), it is preferable that the thickness of the polyester film 22 fall within a range of 20 μm to 30 μm and the thickness of the silicone adhesive layer 23 be 5 μm to 15 μm.

Specifically, it is preferable that the thickness of the polyester film 22 be 1.3 to 6 times the thickness of the silicone adhesive layer 23.

When the area of the graphite sheet 10 is as relatively larger as 4,000 to 15,000 cm$^2$ (for example, 121.7 cm×68.5 cm), it is preferable that the thickness of the polyester film 22 be 45 μm to 55 μm and the thickness of the silicone adhesive layer 23 be 15 μm to 25 μm. Specifically, it is preferable that the thickness of the polyester film 22 be 1.8 to 3.6 times the thickness of the silicone adhesive layer 23.

<8. Production Method of Graphite Sheet with Adhesive>

In a production method of a graphite sheet with an adhesive of the present invention, the above-described graphite sheet 10 is prepared, the acrylic adhesive layer 21, the polyester film 22, and the silicone adhesive layer 23 may be sequentially formed on the graphite sheet 10. Alternatively, a double-sided adhesion sheet in which the acrylic adhesive layer 21 is formed on a surface of the polyester film 22 and the silicone adhesive layer 23 is formed on another surface is prepared, and the double-sided adhesion sheet on the acrylic adhesive layer 21 and the graphite sheet 10 are layered. Thus, the heat diffusion sheet (graphite sheet with an adhesive) 2 of the present invention may be produced.

Further, an intermediate sheet A in which the silicone adhesive layer 23 is formed on the polyester film 22 is formed, and an intermediate sheet B in which the acrylic adhesive layer 21 is formed on a release film is formed. A surface of the polyester film 22 of the intermediate sheet A is brought into contact with a surface of the acrylic adhesive layer 21 of the intermediate sheet B, and the intermediate sheets A and B are bonded to each other to form the composite adhesive film 11 that is the double-sided adhesion sheet. The release film on the acrylic adhesive layer 21 side is removed, an exposed surface of the acrylic adhesive layer 21 is brought into contact with a surface of the graphite sheet 10, so that the composite adhesive film 11 is bonded to the graphite sheet 10. Thus, the heat diffusion sheet 2 of the present invention may be produced.

The intermediate sheet A in which the silicone adhesive layer 23 is provided on the polyester film 22 and an intermediate sheet C in which a material for the acrylic adhesive layer 21 is applied to the graphite sheet to form the acrylic adhesive layer 21 are prepared. A surface of the polyester film 22 of the intermediate sheet A is exposed, and the exposed surface is brought into contact with a surface of the acrylic adhesive layer 21 of the intermediate sheet C and bonded. Thus, the heat diffusion sheet 2 of the present invention may be produced.

EXAMPLES

Hereinafter, the present invention will be described more specifically by Examples.

<Production Method of Graphite Sheet>

100 Parts by weight of natural graphite was immersed in about 15 parts by weight of mixed liquid in which potassium permanganate was dissolved in concentrated sulfuric acid, to obtain scale-shaped graphite. The scale-shaped graphite was heated to about 900° C. to be expanded to a volume ratio of 150 cm$^3$/g. The expanded graphite was press-molded to obtain a graphite sheet 10 formed of an expanded graphite-rolled sheet having a density of 1.5 g/cm$^3$. This graphite sheet was further rolled to obtain a film-shaped rolled sheet having a thickness of 0.5 mm. The thermal diffusivity thereof was measured by a thermowave analyzer capable of measuring the thermal diffusivity in a plane direction. The thermal diffusivity was $3 \times 10^{-4}$ m$^2$/s.

<Production Method of Silicone Adhesive Layer>

15 Parts by mass of mixed solvent of toluene and methyl ethyl ketone (6:4 by mass) and 0.1 parts by mass of a platinum catalyst [available from Shin-Etsu Chemical Co., Ltd.: trade name "PL-50T"] were added to 10 parts by mass of an addition-type organopolysiloxane including organodimethylpolysiloxane having a vinyl group as an alkenyl group and organohydrogenpolysiloxane [available from Shin-Etsu Chemical Co., Ltd.: trade name "KS-847H"; solid content: 30% by mass], to prepare a coating liquid (solid content: 12% by mass). The coating liquid was applied to each of a polyester film 22 having a thickness of 20 μm and another polyester film 22 having a thickness of 50 μm [polyethylene terephthalate film available from Teijin DuPont Films Japan Limited: trade name "G2"] by a Meyer bar #3, and dried at 160° C. for 60 seconds. A silicone adhesive layer 23 formed of silicone elastomer and having slight adhesion was thus produced on each polyethylene terephthalate film.

The coating liquid was applied to the polyester film 22 having a thickness of 50 m in a coating amount of 1.0 g/m$^2$, to obtain the silicone adhesive layer 23 having a thickness of 20 μm.

The coating liquid was applied to the polyester film 22 having a thickness of 20 μm in a coating amount of one-quarter of the amount, to obtain the silicone adhesive layer 23 having a thickness of 5 μm.

<Production Method of Acrylic Adhesive Layer>

5 Parts by weight of a hydrogenated rosin [available from ARAKAWA CHEMICAL INDUSTRIES, LTD., trade name "KE311"] as a tackifier was mixed in 55 parts by weight of mixed resin liquid of an acrylic monomer and an acrylic polymer. Further, 40 parts by weight of toluene was added and mixed until the mixture became uniform. To the mixture, 2 parts by weight of a TDI-based isocyanate-modified crosslinker [available from Nippon Polyurethane Industry Co., Ltd.: trade name "CORONATE L"] was added, and the mixture was further mixed until the mixture became uniform. The coating liquid was applied to a release film having a thickness of 38 μm in a coating amount of 10 g/m$^2$ by a Meyer bar #3 and dried at 130° C. for 120 seconds to form an acrylic adhesive layer 21 having a thickness of 10 μm on the release film.

<Composite Adhesive Film>

The compositions obtained above were laminated by a device capable of heating at a line pressure of 1 kg/cm, to form a composite adhesive film 11 having a structure in which the silicone adhesive layer 23 was disposed on a surface of the polyester film 22 and the acrylic adhesive layer 21 was disposed on an opposite surface of the polyester film 22.

Examples 1 and 2

The graphite sheet 10 and the composite adhesive film 11 produced at the aforementioned steps were hot-pressed under vacuum to obtain a heat diffusion sheet 2 in which the acrylic adhesive layer 21 was in contact with the graphite sheet 10 and fixed.

This heat diffusion sheet 2 was a layered body having a size of about 1,200 mm×720 mm×0.6 mm. The heat diffusion sheet 2 (Example 1) having the polyester film of 20 μm and the heat diffusion sheet 2 (Example 2) having the polyester film of 50 μm were produced.

Comparative Example 1

A heat diffusion sheet was produced by bonding a double-sided adhesion sheet that did not contain a thermally conductive material and had an acrylic adhesive layer on both surfaces ("commercial product 1") instead of the composite adhesive film 11 used in the present invention as a composite adhesive film to a surface of the graphite sheet 10. In the double-sided adhesion sheet, the acrylic adhesive layer was formed so as to have a thickness of about 30 m on the graphite sheet side, and the acrylic adhesive layer was formed so as to have a thickness of 5 μm on an adherend side. The double-sided adhesion sheet was a so-called adhesion sheet with different adhesion due to the relationship in thickness.

Comparative Example 2

A heat diffusion sheet was produced by bonding a double-sided adhesion tape that did not contain a thermally conductive material and had an acrylic adhesive layer on both surfaces ("commercial product 2") instead of the composite adhesive film 11 used in the present invention as a composite adhesive film to a surface of the graphite sheet 10. In the heat diffusion sheet, the acrylic adhesive layer was formed so as to have a thickness of about 30 μm on the graphite sheet 10 side, and the acrylic adhesive layer was formed so as to have a thickness of 30 μm also on an adherend side. The heat diffusion sheet was a so-called adhesion sheet with different adhesion due to difference in components.

Comparative Example 3

A silicone adhesive sheet available from Dexerials Corporation [trade name: T4082S] was used as the silicone adhesive layer 23 to form a composite adhesive film. An acrylic adhesive layer 21 of the composite adhesive film was bonded to a surface of the graphite sheet 10 to produce a heat diffusion sheet.

Comparative Example 4

A silicone adhesive layer 23 was formed by applying the aforementioned coating liquid to the graphite sheet 10 produced at the aforementioned step and drying, to produce a heat diffusion sheet. A composite adhesive film was not used.

<Measurement Test>

The heat diffusion sheet of each of Examples 1 and 2 and Comparative Examples 1 to 3 was tested on the following tests.

Thermal Diffusivity Test

Each of the heat diffusion sheets was cut into 15 mm×15 mm by a punch, and the thermal diffusivity at which the sheet reached the equilibrium state at a temperature of 25° C. was calculated by a thermal diffusivity measurement device (thermowave analyzer TA3: manufactured by Bethel Co., Ltd.). It is preferable that the thermal diffusivity be higher, and desirably $10^{-4}$ m$^2$/s or more.

Reworking Properties Test

Each of the heat diffusion sheets was laminated on a glass plate (soda-lime glass) of 1,300 mm×800 mm at a line pressure of 1 kg/cm. After 7 days at normal temperature, whether the composite adhesive film could be peeled from the glass plate was confirmed. Further, whether a peeled residue remained after the peeling was confirmed.

Adhesion Reliability Test

Each of the heat diffusion sheets was laminated on a glass plate (soda-lime glass) of 1,300 mm×800 mm at a line pressure of 1 kg/cm, and put in an air constant temperature-constant humidity oven adjusted to 60° C. and 75% RH. After 1,000 hours, the appearance was confirmed.

<Test Results>

Measured Value

The results of each test are shown in Tables 1 and 2 below.

TABLE 1

Results of Measurement of Heat Diffusion Sheets of Examples 1 to 2

|  | Example 1 | Example 2 |
|---|---|---|
| Thickness of Graphite Sheet (μm) | 500 | 500 |
| Thickness of Acrylic Adhesive Layer (μm) | 10 | 10 |
| Thickness of Polyester Film (μm) | 20 | 50 |
| Thickness of Silicone Adhesive Layer (μm) | 5 | 20 |
| Peel Strength of Silicone Adhesive Layer on Adherend Side (N/cm) | 0.4 | 0.3 |
| Total Thickness of Composite Adhesive Film (μm) | 40 | 80 |
| Thickness of Polyester Film (μm)/Thickness of Silicone Adhesive Layer (μm) | 5 | 2.5 |
| Thermal diffusivity (m$^2$/S) | $3 \times 10^{-4}$ | $2 \times 10^{-4}$ |
| Reworking Properties | A (Good) | B (Possible) |
| Adhesion Reliability | A (Good) | A (Good) |

TABLE 2

Results of Measurement of Heat Diffusion Sheets of Comparative Examples 1 to 4

|  | Comparative Example 1 | Comparative Example 2 | Comparative Example 3 | Comparative Example 4 |
|---|---|---|---|---|
| Thickness of Graphite Sheet (μm) | 500 | 500 | 51 | 25 |
| Thickness of Acrylic Adhesive Layer (μm): Graphite sheet side | 30 | 30 | 10 | None |
| Thickness of Silicone Adhesive Layer (μm): Graphite sheet side | — | — | — | None |
| Thickness of Polyester Film (μm) | 15 | 25 | 33 | None |
| Thickness of Silicone Adhesive Layer (μm): Adherend side | — | — | 38 | 20 |
| Thickness of Acrylic Adhesive Layer (μm): Adherend side | 5 | 30 | — | — |
| Peel Strength of Silicone Adhesive Layer or Acrylic Adhesive Layer on Adherend Side (N/cm) | 2.5 | 5 | 4 | — |
| Total Thickness of Composite Adhesive Film (μm) | 50 | 85 | 81 | — |
| Thickness of Polyester Film (μm)/Thickness of Silicone Adhesive Layer (μm): Adherend side | 3 | 0.8 | 0.9 | — |
| Thermal diffusivity (m$^2$/s) | $8 \times 10^{-5}$ | $7 \times 10^{-5}$ | $5 \times 10^{-5}$ | $4 \times 10^{-4}$ |
| Reworking Properties | A (Good) | C (Poor) | C (Poor) | C (Poor) |
| Adhesion Reliability | C (Poor) | B (Possible) | A (Good) | A (Good) |

Evaluation of Reworking Properties

In Tables 1 and 2, the following evaluations are shown in columns of reworking properties.

A Good: the heat diffusion sheet can be peeled from the glass plate with less power, and a residue does not remain on a surface peeled from the glass plate.

B Possible: the heat diffusion sheet can be mostly peeled, and a residue does not remain on a surface peeled from the glass plate.

C Poor: Considerable power is required to peel the heat diffusion sheet from the glass plate, and a residue remains on a surface peeled from the glass plate.

Evaluation of Adhesion Reliability

In Tables 1 and 2, the following evaluations are shown in columns of adhesion reliability.

A Good: floating does not completely occur, and end parts are entirely bonded.

B Possible: floating hardly occurs, but the end parts partially rise.

C Poor: floating occurs, and the end parts rise.

REFERENCE SIGNS LIST 2 heat diffusion sheet
10 graphite sheet
11 composite adhesive film
21 acrylic adhesive layer
22 polyester film
23 silicone adhesive layer

The invention claimed is:

1. A heat diffusion sheet comprising a graphite sheet and a composite adhesive film formed on a surface of the graphite sheet, wherein
the graphite sheet has a thickness of 300 μm or more and 2,000 μm or less,
the composite adhesive film includes:
(A) an acrylic adhesive layer that has a thickness of 5 μm or more and 15 μm or less and does not contain a thermally conductive material,
(B) a polyester film having a thickness of 20 μm or more and 60 μm or less, and
(C) a silicone adhesive layer that has a thickness of 2 μm or more and 25 μm or less, does not contain a thermally conductive material, and has a peel strength of 0.005 N/cm or more and 1.0 N/cm or less,
the acrylic adhesive layer, the polyester film, and the silicone adhesive layer are sequentially layered from the graphite sheet,
the polyester film is a biaxially stretched polyethylene terephthalate (PET) film,
a tensile strength of the composite adhesive film in a MD direction falls within a range of 100 MPa or more and 300 MPa or less,
a tensile strength of the composite adhesive film in a TD direction falls within a range of 10 MPa or more and 50 MPa or less, and
a storage elastic modulus of the composite adhesive film falls within a range of 1,000 Pa or more and 10,000 MPa or less.

* * * * *